United States Patent
Marty et al.

(10) Patent No.: US 8,524,522 B2
(45) Date of Patent: Sep. 3, 2013

(54) MICROELECTRONIC DEVICE, IN PARTICULAR BACK SIDE ILLUMINATED IMAGE SENSOR, AND PRODUCTION PROCESS

(75) Inventors: Michel Marty, Varces (FR); Didier Dutartre, Meylan (FR); Francois Roy, Seyssins (FR); Pascal Besson, Notre Dame de Message (FR); Jens Prima, Grenoble (FR)

(73) Assignees: STMicroelectronics S.A., Montrouge (FR); STMicroelectronics (Crolles 2) SAS, Crolles Cedex (FR)

( * ) Notice: Subject to any disclaimer, the term of this patent is extended or adjusted under 35 U.S.C. 154(b) by 21 days.

(21) Appl. No.: 12/963,792

(22) Filed: Dec. 9, 2010

(65) Prior Publication Data
US 2011/0140220 A1   Jun. 16, 2011

(30) Foreign Application Priority Data
Dec. 16, 2009   (FR) ...................... 09 59060

(51) Int. Cl.
*H01L 21/00* (2006.01)
*H01L 21/46* (2006.01)
*H01L 31/0232* (2006.01)
*H01L 27/148* (2006.01)

(52) U.S. Cl.
USPC ............. 438/69; 438/458; 438/459; 257/228; 257/E31.127; 257/432

(58) Field of Classification Search
USPC ..................... 438/64, 69, 458, 459; 257/432, 257/E31.127, E31.13
See application file for complete search history.

(56) References Cited

U.S. PATENT DOCUMENTS

| | | | |
|---|---|---|---|
| 5,227,313 A | 7/1993 | Gluck et al. | |
| 5,476,813 A | 12/1995 | Naruse | |
| 7,358,512 B1 * | 4/2008 | Lordi | 250/492.24 |
| 2004/0007722 A1 * | 1/2004 | Narui et al. | 257/228 |
| 2005/0170611 A1 * | 8/2005 | Ghyselen et al. | 438/458 |
| 2007/0235829 A1 * | 10/2007 | Levine et al. | 257/437 |
| 2008/0001179 A1 * | 1/2008 | Roy | 257/228 |
| 2008/0017946 A1 * | 1/2008 | Cazaux et al. | 257/447 |
| 2008/0061330 A1 | 3/2008 | Shiau et al. | |
| 2009/0298260 A1 * | 12/2009 | Zhu et al. | 438/458 |

FOREIGN PATENT DOCUMENTS
JP   2005150521 A   6/2005

OTHER PUBLICATIONS
International Search Report, mailed Jul. 16, 2010, for FR 0959060 (2 pages).
English Abstract for JP2005150521 (1 page).

* cited by examiner

*Primary Examiner* — Daniel Luke
*Assistant Examiner* — Khaja Ahmad
(74) *Attorney, Agent, or Firm* — Gardere Wynne Sewell LLP

(57) ABSTRACT

A process for producing a microelectronic device includes producing a first semiconductor substrate which includes a first layer and a second layer present between a first side and a second side of the substrate. First electronic components and an interconnecting part are produced on and above the second side. The substrate is then thinned by a first selective etch applied from the first side and stopping on the first layer followed by a second selective etch stopping on the second layer. A second substrate is attached over the interconnecting part. The electronic components may comprise optoelectronic devices which are illuminated through the second layer.

14 Claims, 2 Drawing Sheets

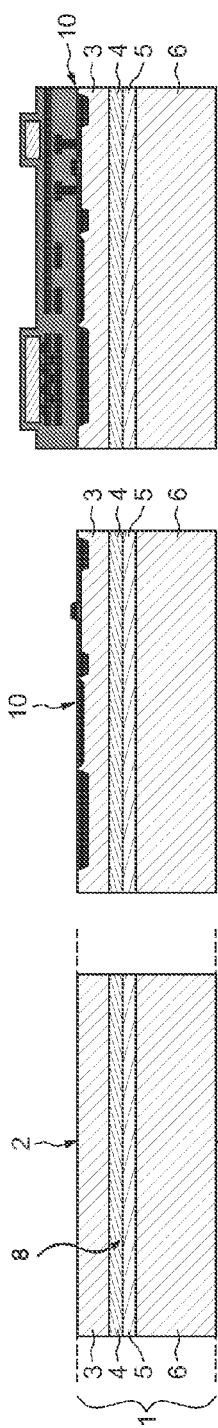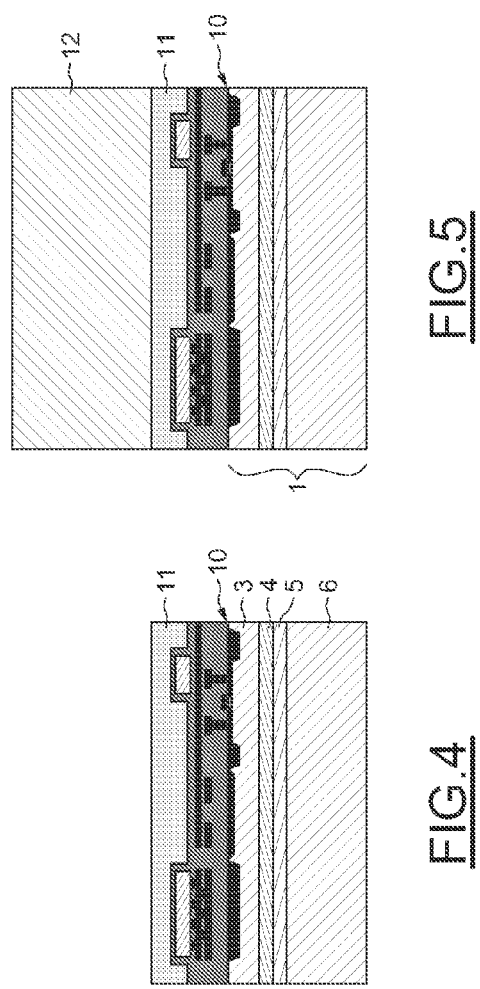

MICROELECTRONIC DEVICE, IN PARTICULAR BACK SIDE ILLUMINATED IMAGE SENSOR, AND PRODUCTION PROCESS

PRIORITY CLAIM

This application claims priority from French Application for Patent No. 09-59060 filed Dec. 16, 2009, the disclosure of which is incorporated by reference.

TECHNICAL FIELD

The invention relates to the field of microelectronics and more particularly to back side illuminated optoelectronic devices as well as to their production.

Silicon-on-insulator (SOI) substrates are replacing conventional silicon substrates in the production of a number of devices, especially in the microwave field and the transistor field. These substrates are the result of a complex process involving an implantation of hydrogen into the substrate followed by a high-temperature treatment to create a zone of weakness in the crystal. The substrate thus treated is next directly bonded to another substrate before cleavage through the zone of weakness created in the substrate. A sandwich is thus obtained consisting of the silicon substrate, silicon oxide and of silicon in which devices may be produced while being insulated from the substrate. The thickness of silicon in which the devices are produced is limited by the depth to which the hydrogen is implanted so as to form the cleavage zone. The quality of the silicon is that of the initial substrate into which the hydrogen is implanted. The quality of the new substrate so bonded is that of the support onto which the implanted substrate is transferred. The production process allows defect-free crystalline layers and a good quality interface with the insulating oxide to be obtained.

After bonding, silicon may be grown epitaxially on the surface of the silicon layer to adjust the thickness of the silicon layer in which devices will later be produced, the oxide layer being employed as insulation and/or as a stop layer for substrate etch steps. Despite their undeniable advantages, such substrates are more costly than conventional substrates.

Furthermore, CMOS microelectronic imaging devices are experiencing continual and rapid growth of their market. The technological challenge is to reduce the pixel size without compromising pixel performance. Two technologies are currently in competition, front side illumination (FSI) technology and back side illumination (BSI) technology. FSI technology consists in illuminating the device from the front side through the back-end layers, i.e. the side on which the photodiodes or phototransistors are situated and which is overlaid with the circuit interconnects. BSI technology consists in illuminating the device from its back side, the radiation being directly absorbed by the silicon substrate.

The two technologies have advantages and drawbacks. BSI technology allows photogeneration effects (cross-talk, quantum yield) to be more easily controlled and parasitic reflections caused by metal lines to be avoided. BSI technology is thus better suited to the production of pixels with small dimensions. Currently, BSI technology is immature and produced on SOI substrates, which were described above. These particularly costly substrates are slowing the technological and commercial development of such microelectronic devices.

SUMMARY

According to one manner of implementation and an embodiment, production of a thinned substrate covered with a superficial layer of SiGe allowing production of a CMOS image sensor designed to be back side illuminated, is proposed.

According to another manner of implementation and an embodiment, it is proposed to produce such a sensor from a bulk substrate thinned by successive selective etches leading to a uniform and controlled thickness across the whole of the semiconductor wafer.

According to one aspect, a process for producing a microelectronic device is proposed, comprising production of a first semiconductor substrate comprising formation of a first layer, for example $p^{++}$-doped silicon (Si), and of a second layer, for example of silicon-germanium (SiGe), between a first side and a second side of the substrate, production of first components and of an interconnecting part on and above the second side, and thinning of the substrate comprising a first selective etch of the first substrate from the first side, stopped on the first layer, followed by a second selective etch, stopped on the second layer.

The thinning of the substrate especially allows back side illumination of an image sensor produced in and on this substrate.

The first selective etch, preferably a chemical etch, allows the variation in thickness of the substrate to be reduced while the second selective etch (for example a chemical or plasma etch), allows the required thickness of silicon to be obtained in a controlled manner.

The production of the first substrate preferably comprises epitaxial growth of the first layer on an initial substrate, for example a $p^-$-doped bulk silicon wafer, epitaxial growth of the second layer on the first layer and epitaxial growth of a final semiconductor layer, for example $p^-$-doped or $n^-$-doped silicon (Si) on the second layer.

The epitaxy of the final semiconductor layer may be carried out until a layer thickness of between 2 μm and 6 μm is reached. This thickness is the thickness of the semiconductor layer through which the image sensor photodiodes will be illuminated. The production of first components may comprise the production of components such as photodiodes and MOS transistors.

The epitaxy of the second layer may comprise an epitaxy of SiGe. The SiGe layer, at least partially preserved after thinning, serves as a channel for electrons so as to reduce, or even eliminate, the dark current of the image sensor.

The epitaxy of the first layer may comprise an epitaxy of $p^{++}$-doped Si.

An intermediate epitaxy of $p^-$-silicon may be added between the $p^{++}$-silicon layer and the SiGe layer leading to an increase in the etch rate selectivity between the p-doped silicon layers and the SiGe.

The process may comprise, before the thinning of the substrate, an encapsulation of the first components and of the interconnecting part with at least one insulating material, and the attachment of a second substrate to the encapsulating insulator.

The process may comprise, after the second etch, deposition of a passivation layer on the second layer. This passivation layer thus forms the back side of an image sensor.

The method may comprise production of second components on the passivation layer, for example lenses and color filters.

The first layer may have an etch rate selectivity with respect to the second layer (4) of between 30 and 500, preferably between 60 and 100.

According to another aspect, a microelectronic device is proposed comprising a semiconductor layer, a superficial layer formed on a first side of the semiconductor layer, first components and an interconnecting part that are placed on and above a second side of the semiconductor layer.

The semiconductor layer may have a thickness of between 2 µm and 6 µm.

The superficial layer may comprise an SiGe layer.

The first components may comprise optoelectronic components, for example photodiodes, designed to be illuminated through the semiconductor layer and the superficial layer.

The first components and the interconnecting part may be encapsulated in at least one insulating material, a second substrate being attached to the insulating encapsulation.

The microelectronic device may comprise a passivation layer on the superficial layer.

The microelectronic device may comprise second components on the passivation layer.

The second components may comprise optical components, for example microlenses and/or color filters.

According to another aspect, an image sensor is proposed comprising a microelectronic device such as that defined hereinabove designed to be illuminated from the back side.

According to one embodiment, such an image sensor has the advantage of being produced in two steps. The first step allows the thickness variation of the CMOS portion to be reduced, by grinding the bulk silicon substrate until there remains a thickness beneath the CMOS of 5 to 10 µm, and then by selective (preferably chemical) etching of the p$^-$-doped silicon, stopping on the p$^{++}$-doped silicon layer. The second step allows the required thickness of silicon beneath the CMOS to be obtained in a controlled manner by highly selective, especially chemical or plasma, etching of the p$^{++}$-doped silicon layer, stopping on the SiGe layer.

According to one embodiment, such an image sensor also has the advantage of preserving a SiGe layer after the thinning step, which provides a channel for electrons so as to reduce, or even eliminate, the dark current.

BRIEF DESCRIPTION OF THE DRAWINGS

Other objects, features and advantages will become clear on reading the following description, given merely by way of non-limiting example, and with reference to the appended drawing in which:

FIGS. 1 to 9 illustrate one manner of implementing a process for producing a microelectronic device according to the invention.

DETAILED DESCRIPTION OF THE DRAWINGS

Figure 6:
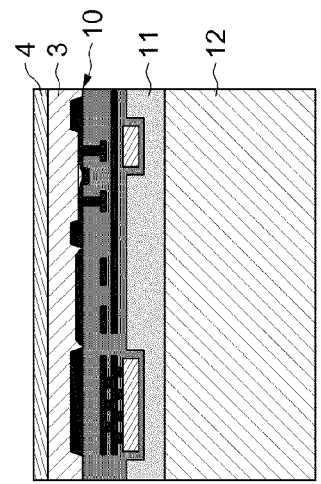

In FIG. 1, the reference 1 denotes a first semiconductor substrate used in one manner of implementing a process for producing a microelectronic device according to the invention.

To obtain this first substrate 1, a first layer 5 is produced on a silicon substrate 6, for example a p$^+$-doped silicon substrate. Next, a second layer 4 is produced on the first layer 5 followed by a final semiconductor layer 3 on the second layer 4.

The production of the first layer 5, of the second layer 4, and of the final semiconductor layer 3 may result from an epitaxy.

The epitaxial thicknesses are dependent on the etch rate selectivities and tolerances during etching. The higher the etch rate selectivity, the thinner the layer relative to the thickness of the etched layer may be. Particular mention must be made concerning the epitaxy of the final semiconductor layer. This is because the components of the device are intended to be produced on both sides of the final semiconductor layer after the thinning step. The thickness of the final semiconductor layer thus determines the thickness of the silicon in the device on completion of the production process. Generally, an epitaxial layer of between 2 µm and 6 µm is produced.

Likewise, the materials of the first layer 5 and of the second layer 4 are chosen so that there exists a difference between the etch rate of the first layer 5 and the silicon substrate 6 and between the first layer 5 and the second layer 4. The differences in etch rates are generally called etch rate selectivities or just selectivities.

By the choice of materials, it is sought, during the second step, to etch the silicon substrate 6 faster than the first layer 5, the etch rate of which is itself faster than that of the second layer 4. For example, to obtain such selectivities, silicon, highly p$^{++}$-doped to around $5 \times 10^{19}$ cm$^{-3}$ to $2 \times 10^{20}$ cm$^{-3}$, is chosen as the material of the first layer 5 and SiGe as the material of the second layer 4. Generally an etch selectivity between the first layer and the second layer of between 30 and 500, preferably between 60 and 100, is chosen.

In an imaging application, the thicknesses and the doping of the p$^{++}$- and SiGe epitaxial layers are determined so as to ensure a lateral electric field (or drift field) beneath the photodiode.

By way of indication, the thickness of the p$^{++}$-layer is between 1 and 2 µm, whereas the thickness of the SiGe layer is between 20 and 50 nm.

The first semiconductor substrate 1 thus obtained comprises a first side 7 which is the same as the lower surface of the silicon substrate 6 and a second side 2 which is the same as the upper surface of the final semiconductor layer 3.

During a second step (FIGS. 2 and 3), a set of first components 10 is produced on and in the second side 2. FIG. 2 shows the production of first components 10 of the electronic device on the second side 2 of the substrate. These components may be for example CMOS transistors and/or photodiodes. FIG. 3 shows the production of interconnect levels for interconnecting the first components, as well as for preparing zones that will interact with connection vias on completion of the production process, may be seen.

The first components 10 and the interconnect area are then encapsulated with an insulator 11. This material may be a dielectric used in microelectronics, for example a silicon oxide or nitride.

Figure 7:
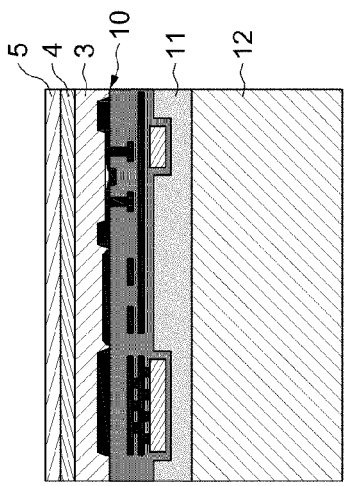
Figure 8:
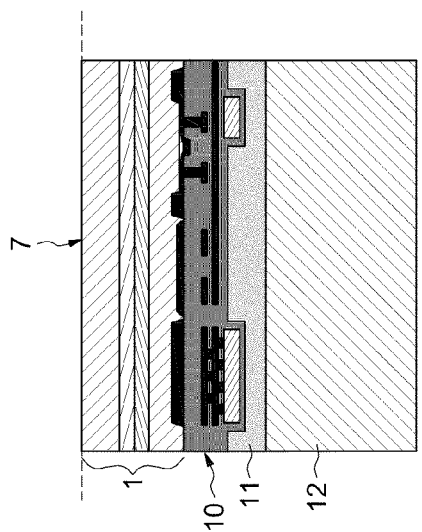

After a planarization step not illustrated in FIG. 4, the first substrate 1 is attached by means of the insulating material encapsulation 11 to a second substrate 12, for example by direct bonding. The second substrate 12 has no particular characteristics beyond its ability to support the first substrate 1 so that manipulation of the first substrate 1 is less of a risk due to its thickness being of the order of a few microns after thinning. The result obtained is illustrated in FIG. 5. The first substrate 1 will then undergo a thinning step, as illustrated in FIGS. 6 to 8.

After coarse grinding of the silicon 6, a first etch, stopped on the first layer 5, is performed which allows the complete removal of the silicon substrate 6, as well as a part of the first layer 5. The first layer 5 may, without distinction, be partially or totally removed during this first etch. The result is illustrated by FIG. 7.

The first etch may, without distinction, be associated with a wet etch step (for example a dilute tetramethylammonium hydroxide (TMAH) solution) and/or a fluorine plasma dry etch. The aim of this etch is to reduce the thickness of the substrate to a thickness close to the value required for the device. The most important characteristic of this first etch is that it has a high etch rate allowing the targeted thickness to be rapidly obtained. The thickness variation of the silicon in which the CMOS components were fabricated is reduced relative to the grinding step. The total thickness variation (TTV) is between 0.5 and 2 μm depending on the method used. However, the result obtained is not sufficient to guarantee a uniform behavior of the imagers over the entire wafer. A selectivity of approximately 10 between the etch of the silicon substrate 6 and of the $p^{++}$-doped silicon first layer 5 allows a fast etch to be obtained.

The process then continues with a second etch to remove the material left over by the first etch. The second layer 4 may, without distinction, be left unchanged or partially or totally removed during the second etch. Optionally, a layer 8 of $p^-$-silicon may be inserted between the layers 4 and 5 in order to separate said layers and to further increase the overall selectivity of the process. In this case, the first etch will be selective with respect to the $p^-$-doped silicon layer 8 and an additional etch, selective with respect to the layer 4, will be added to selectively remove the inserted $p^-$-doped silicon layer 8. The additional etch is preferably a wet etch of $HNO_3$+HF type.

This being so, in an imager application, this second layer 4 of SiGe is advantageously at least partially preserved.

The second etch is, without distinction, a wet etch and/or a remote plasma dry etch that uses a gas mixture, for example a $CF_4+N_2+O_2+CH_2F_2$ mixture. The aim of this etch is to complete the reduction in thickness of the substrate to the thickness required for the device. The most important characteristic of this second etch is a very high selectivity between the etching of the first silicon layer 5 and of the second SiGe layer 4. The selectivity is greater than 30. This enables a very low silicon TTV, between 0.05 and 0.3 μm, to be obtained. The result of the second etch is illustrated by FIG. 8.

Figure 9:
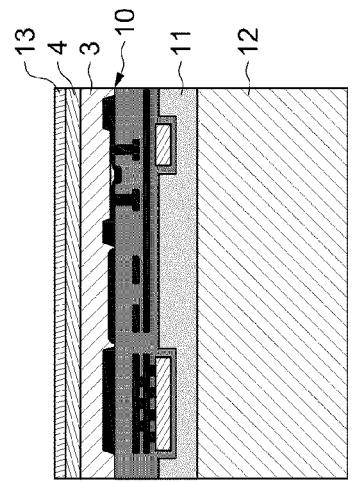

The process continues with the deposition of a passivation layer 13, which may be silicon oxide with a thickness of between 0.05 and 0.3 μm, on the second layer 4 after the second etch. The result is illustrated by FIG. 9.

The process concludes with production, in a conventional manner, of the second portion 14 of device components on the passivation layer 13. The second portion 14 of components may comprise through-vias, anti-reflection coatings, filters and lenses. The result is illustrated by FIG. 10.

Figure 10:
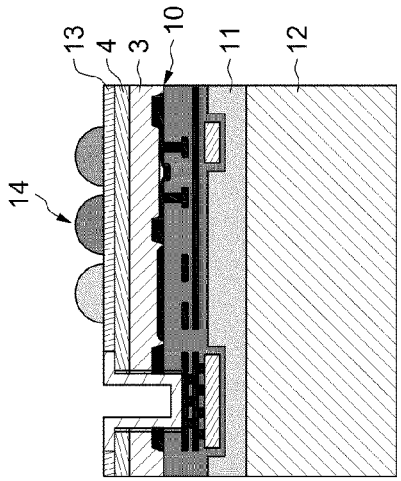
FIG. 10 illustrates an embodiment of an image sensor incorporating an embodiment of a microelectronic device according to the invention.

FIG. 10 also illustrates an embodiment of a microelectronic device according to the invention.

Thus, the device of FIG. 10 shows again the semiconductor layer 3 covered with the superficial layer 4 which is here a layer of silicon-germanium (SiGe) particularly beneficial in the field of image sensors. This is because such a layer, which served as a stop layer during the thinning of the substrate, also plays an electrical role since, because of its smaller bandgap, it traps and recombines thermally excited electrons at the interface with the passivation layer 13 (silicon oxide for example), which has the effect of reducing the dark current of the imager, i.e. the current in the absence of light.

The upper side of the passivation layer, i.e. the side on which the optical components 14, such as color filters and/or microlenses, are produced, constitutes the back side of the image sensor device. This image sensor may thus be back side illuminated. In this respect, the semiconductor layer 3 of crystalline quality and small thickness (typically between 2 μm and 6 μm) allows, the CMOS components to function and, at the same time, photon capture and electron transfer as close as possible to the component.

Furthermore, by the diffusion of p-dopants from the $p^{++}$-layer, a doping profile is obtained beneath the photodiodes allowing the setup of a non-retrograde lateral electric field (drift field) in the silicon facilitating electron transfer.

What is claimed is:

1. A process, comprising:
    producing a first multi-layer substrate having a top surface and a bottom surface, the multi-layer substrate including a top layer defining the top surface, a first intermediate SiGe layer below the top layer, a second intermediate Si layer below the first intermediate layer and a substrate layer below the second intermediate layer and defining the bottom surface;
    producing electronic devices in and on the top layer of the first multi-layer substrate;
    producing an interconnect layer over the electronic devices;
    producing an encapsulating layer over the interconnect layer;
    attaching a second substrate to the encapsulating layer;
    thinning the first multi-layer substrate by use of an etch selective of Si so as to remove the substrate layer and second intermediate layer and leaving the top layer and first intermediate SiGe layer; and
    producing a passivation layer on a bottom etched surface of the first intermediate SiGe layer of the thinned first multi-layer substrate.

2. The process of claim 1 wherein the electronic devices are optoelectronic devices in the top layer that are illuminated through the passivation layer and first intermediate SiGe layer.

3. The process of claim 2 further comprising producing an optical filter layer on the passivation layer and over the optoelectronic devices.

4. The process of claim 3 further comprising producing optical lenses over the optical filter layer and optoelectronic devices.

5. The process of claim 1 wherein the top layer is an epitaxially grown layer, the substrate layer is a base semiconductor layer and the second Si intermediate layer is a doped semiconductor layer.

6. The process of claim 1 wherein the top layer has a thickness of between 2 μm and 6 μm.

7. The process of claim 1, wherein the selective etch has an etch rate selectivity between the first intermediate SiGe layer and at least the second intermediate Si layer of between 30 and 500.

8. A process, comprising:
    producing a semiconductor substrate which includes at least a first layer, an underlying second SiGe layer and an underlying third Si layer that are located between a first substrate side and a second substrate side;
    producing integrated circuit components on the first substrate side;
    producing an interconnecting layer over the integrated circuit components;
    thinning the semiconductor substrate from the second substrate side, wherein thinning comprises selectively etching the second substrate side to remove the third Si layer of the semiconductor substrate and stop at the second SiGe layer; and
    depositing a passivation layer on a bottom etched surface of the second SiGe layer.

9. The process according to claim 8, wherein producing integrated circuit components comprises producing optoelectronic integrated circuit components.

10. The process according to claim 8, further comprising producing optical components on the passivation layer.

11. The process according to claim 10, wherein the optical components comprise optical lens structures.

12. The process according to claim 10, wherein the optical components comprise optical filter structures.

13. The process according to claim 10, wherein producing integrated circuit components comprises producing optoelectronic integrated circuit components, said optoelectronic integrated circuit components configured to be illuminated through said optical components on the passivation layer.

14. The process according to claim 8, wherein producing integrated circuit components on the first substrate side comprises fabricating the integrated circuit components in said first layer.

* * * * *